United States Patent
Tsai

(10) Patent No.: US 6,815,376 B2
(45) Date of Patent: Nov. 9, 2004

(54) MICROELECTRONIC SUBSTRATE EDGE BEAD PROCESSING APPARATUS AND METHOD

(75) Inventor: Ming-Hung Tsai, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 223 days.

(21) Appl. No.: 10/172,611

(22) Filed: Jun. 14, 2002

(65) Prior Publication Data

US 2003/0232282 A1 Dec. 18, 2003

(51) Int. Cl.[7] .................. H01L 21/42; H01L 21/324; G03F 7/20; G03F 7/26
(52) U.S. Cl. .................. 438/795; 438/782; 430/311; 430/319; 355/67
(58) Field of Search .................. 438/795, 780, 438/782; 430/311, 319; 355/66, 67

(56) References Cited

U.S. PATENT DOCUMENTS

| | | | |
|---|---|---|---|
| 5,675,401 A | 10/1997 | Wangler et al. | |
| 5,824,457 A | 10/1998 | Liu et al. | |
| 6,117,778 A | 9/2000 | Jones et al. | |
| 6,126,517 A | * 10/2000 | Tolles et al. | 451/41 |
| 6,265,328 B1 | 7/2001 | Henley et al. | |
| 6,497,784 B1 | * 12/2002 | Jones et al. | 156/345.12 |
| 6,692,339 B1 | * 2/2004 | Halley | 451/41 |

* cited by examiner

Primary Examiner—Alexander Ghyka
(74) Attorney, Agent, or Firm—Tung & Associates

(57) ABSTRACT

Within an edge bead processing apparatus and an edge bead processing method, there is employed at least one of: (1) a nozzle suitable for directing a volume of fluid onto an annular edge ring of a substrate when received upon a platen, wherein the nozzle is geometrically configured to direct the volume of fluid simultaneously to all portions of the annular edge ring absent motion of the substrate with respect to the nozzle; and (2) a reflective optical apparatus suitable for directing a dose of radiation to the annular edge ring of the substrate when received upon the platen, wherein the reflective optical apparatus is geometrically configured to direct the dose of radiation to all portions of the annular edge ring absent movement of the substrate with respect to the reflective optical apparatus.

8 Claims, 1 Drawing Sheet

MICROELECTRONIC SUBSTRATE EDGE BEAD PROCESSING APPARATUS AND METHOD

BACKGROUND OF THE INVENTION

1. Field of the Invention

The present invention relates generally to edge bead processing apparatus and methods for processing microelectronic substrates. More particularly, the present invention relates to edge bead processing apparatus and methods for efficiently processing microelectronic substrates.

2. Description of the Related Art

Common in the art of microelectronic fabrication, and in particular in the art of semiconductor integrated circuit microelectronic fabrication, is the use of edge bead processing apparatus and methods. Edge bead processing apparatus and methods are desirable in the art of microelectronic fabrication insofar as edge bead processing apparatus and methods provide microelectronic substrates which are generally either edge bead protected or edge bead de-protected, such as facilitate further processing of the microelectronic substrates which are processed employing the edge bead processing apparatus and methods.

While edge bead processing apparatus and methods are thus clearly desirable in the art of microelectronic fabrication and often provide considerable value in the art of microelectronic fabrication, edge bead processing apparatus and methods are nonetheless not entirely without problems in the art of microelectronic fabrication. In that regard, as microelectronic fabrication substrate dimensions have increased, edge bead processing apparatus and methods have often become inefficient in edge bead processing microelectronic substrates.

It is thus desirable in the art of microelectronic fabrication to provide edge bead processing apparatus and methods for efficiently processing microelectronic substrates.

It is towards the foregoing object that the present invention is directed.

Various edge bead processing apparatus and methods have been disclosed in the art of microelectronic fabrication.

Included among the edge bead processing apparatus and methods, but not limiting among the edge bead processing apparatus and methods, are edge bead processing apparatus and methods which encompass more generally edge bead processing apparatus (see, e.g., Wangler et al., U.S. Pat. No. 5,675,401), more generally edge bead processing methods (see, e.g., Liu et al., U.S. Pat. No. 5,824,457), as well as generally both edge bead processing apparatus and edge bead processing methods (see, e.g., Jones et al., U.S. Pat. No. 6,117,778 and Henley et al., U.S. Pat. No. 6,265,328).

Desirable in the art of microelectronic fabrication are additional edge bead processing apparatus and methods which provide for efficient edge bead processing of microelectronic substrates.

It is towards the foregoing object that the present invention is directed.

SUMMARY OF THE INVENTION

A first object of the present invention is to provide an edge bead processing apparatus and an edge bead processing method for edge bead processing a microelectronic substrate.

A second object of the present invention is to provide an edge bead processing apparatus and an edge bead processing method in accord with a first object of the present invention, wherein the edge bead processing apparatus and the edge bead processing method provide for efficient edge bead processing of the microelectronic substrate.

In accord with the objects of the present invention, there is provided by the present invention a plurality of edge bead processing apparatus and edge bead processing methods for edge bead processing a microelectronic substrate, wherein the plurality of edge bead processing apparatus and edge bead processing methods provide for efficient edge bead processing of the microelectronic substrate.

In general, the plurality of edge bead processing apparatus provide, at least in part, for a simultaneous edge bead processing of all portions of an annular edge ring within a microelectronic substrate absent movement, such as rotation, of the microelectronic substrate within the edge bead processing apparatus. The edge bead processing apparatus of the present invention realize the foregoing result by employing within the edge bead processing apparatus at least one of a fluid nozzle and a reflective optical apparatus which are configured to achieve the foregoing result. Under circumstances where a substrate is a nominally circular planar substrate, such as in particular a nominally circular planar semiconductor substrate, the foregoing result is achieved employing a conical fluid nozzle and a conical reflective optical apparatus. Since the present invention thus precludes a need for relative motion of a microelectronic substrate with respect to a fluid nozzle or a reflective optical apparatus within an edge bead processing apparatus when edge bead processing the microelectronic substrate while employing the edge bead processing apparatus, the edge bead processing apparatus provides for enhanced efficiency when edge bead processing the microelectronic substrate.

The plurality of edge bead processing apparatus of the present invention contemplate a corresponding plurality of methods for edge bead processing a microelectronic substrate while employing the plurality of edge bead processing apparatus in accord with the present invention.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a plurality of edge bead processing apparatus and edge bead processing methods for edge bead processing a microelectronic substrate, wherein the plurality of edge bead processing apparatus and edge bead processing methods provide for efficient edge bead processing of the microelectronic substrate.

In general, the plurality of edge bead processing apparatus provide, at least in part, for a simultaneous edge bead processing of all portions of an annular edge bead (i.e., annular edge ring) within a microelectronic substrate absent movement, such as rotation, of the microelectronic substrate within the edge bead apparatus. The edge bead processing apparatus of the present invention realizes the foregoing result by employing within the edge bead processing apparatus at least one of a fluid nozzle and a reflective optical apparatus which are configured to achieve the foregoing result. Under circumstances where a microelectronic substrate is a nominally circular planar substrate, such as in particular a nominally circular planar semiconductor substrate, the foregoing result is achieved employing a conical fluid nozzle and a conical reflective optical apparatus. Since the present invention thus precludes a need for relative motion of a microelectronic substrate with respect to a fluid nozzle or a radiation source within an edge bead processing apparatus when edge bead processing the microelectronic substrate while employing the edge bead processing apparatus, the edge bead processing apparatus provides for enhanced efficiency when edge bead processing the microelectronic substrate.

The plurality of edge bead processing apparatus of the present invention contemplate a corresponding plurality of methods for edge bead processing a microelectronic substrate while employing the plurality of edge bead processing apparatus in accord with the present invention.

Figure 1:
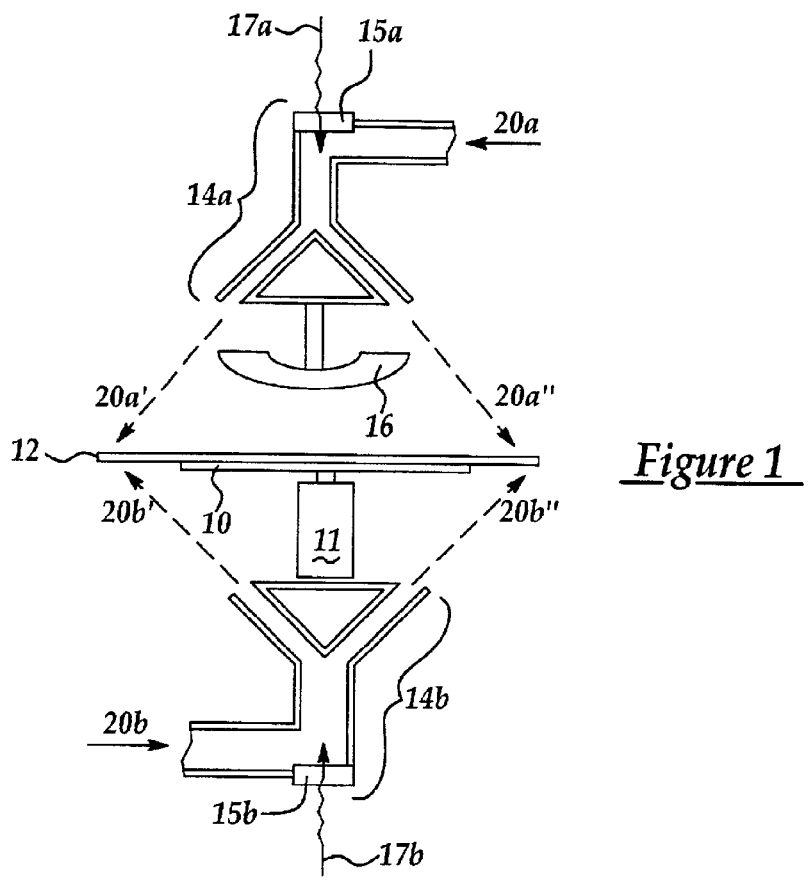
FIG. 1 shows a schematic diagram of an edge bead fluid processing apparatus in accord with a first embodiment of the present invention.

Referring now to FIG. 1, there is shown a schematic diagram illustrating an edge bead fluid processing apparatus in accord with a first embodiment of the present invention.

Shown in FIG. 1 is an edge bead fluid processing apparatus comprising in a first instance a platen 10 (which is intended to include, but is not limited to, a chuck) wherein the platen 10 may have received, positioned and affixed thereupon a substrate 12. Within the first embodiment of the present invention, the platen 10 is sized appropriately to receive the substrate 12, and the substrate may be employed within any of several microelectronic fabrications, including but not limited to integrated circuit microelectronic fabrications, ceramic substrate microelectronic fabrications and optoelectronic microelectronic fabrications, although the present invention provides particular value within the context of edge bead processing of semiconductor substrates employed for fabricating semiconductor integrated circuit microelectronic fabrications.

As is also illustrated within the schematic cross-sectional diagram of FIG. 1, the platen 10 also has assembled thereto a motor 11 such that the substrate 12 may be rotated, but such is not required within the present invention.

As is also illustrated within the schematic cross-sectional diagram of FIG. 1, and juxtaposed each of the planar surfaces of the substrate 12, is a pair of fluid nozzles 14*a* and 14*b* which allow for ingress of a pair of incoming fluid streams 20*a* and 20*b* and egress of a corresponding series of outgoing fluid streams 20*a*', 20*a*", 20*b*' and 20*b*". Shown integral to the fluid nozzle 14*a* only is a fluid drip receptacle 16, and shown integral to each of the fluid nozzles 14*a* and 14*b* is a corresponding pair of windows 15*a* and 15*b* which allow for passage into each of the pair of fluid nozzles 14*a* and 14*b* of a corresponding pair of radiation beams 17*a* and 17*b* which may provide for activating a fluid from which is comprised the pair of supply fluid streams 20*a* and 20*b*.

As is understood by a person skilled in the art, each of the nozzles 14*a* and 14*b* is configured such that the series of discharge fluid streams 20*a*', 20*a*", 20*b*' and 20*b*" impinges upon and thus processes a complete annular edge bead (i.e., a complete annular edge ring (typically of ring width from about 3 to about 8 millimeters)) of the substrate 12, absent movement, such as but not limited to rotation, of the substrate 12 with respect to the pair of fluid nozzles 14*a* and 14*b*. Thus, it is understood by a person skilled in the art that the pair of discharge fluid streams 20*a*' and 20*a*" and the pair of discharge fluid streams 20*b*' and 20*b*" are as pairs representative in a plan view of a contiguous enclosed discharge stream. Thus, in particular under circumstances where the substrate is a planar nominally circular substrate, such as a planar nominally circular semiconductor substrate, the pair of fluid nozzles 14*a* and 14*b* will provide a pair of plan view spray patterns which include the discharge fluid streams 20*a*' and 20*a*", or 20*b*' and 20*b*", which pair define a pair of annular ring shapes. Similarly, when the substrate is other than circular, for example and without limitation square or rectangular, each of the pair of fluid nozzles 14*a* and 14*b* will define a corresponding enclosed square or rectangular annular edge ring shape.

Within the first embodiment of the present invention, the supply fluid streams 20*a* and 20*b* may comprise fluids selected from the group including but not limited to gases and liquids, although liquids are generally common within the present invention. More commonly, the supply fluid streams 20*a* and 20*b* are photoresist developer or photoresist stripper liquid fluid streams which are generally intended to strip photoresist edge beads from both a face surface and a backside surface of the substrate 12. Other liquids, such as but not limited to solvents, acids and bases, may also be employed for the supply fluid streams 20*a* and 20*b*.

As is further understood by a person skilled in the art, the pair of radiation beams 17*a* and 17*b* which is intended to activate a fluid from which is comprised the pair of supply fluid streams 20*a* and 20*b* may be provided employing radiation including but not limited to infrared, microwave, optical and ultrasonic radiation. Such activation may provide a purely physical activation, such as but not limited to a thermal activation, or in an alternative such activation may provide a chemical activation, such as to provide a more chemically active supply fluid stream.

Figure 2:
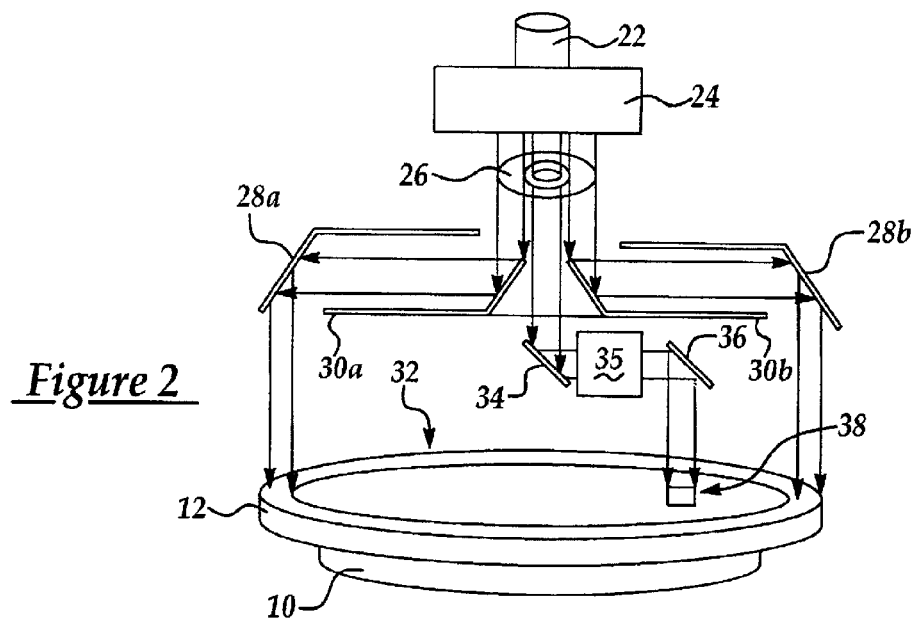
FIG. 2 shows a schematic diagram of an edge bead radiation processing apparatus in accord with a second embodiment of the present invention.

Referring now to FIG. 2, there is shown a schematic diagram of an edge bead radiation processing apparatus in accord with a second embodiment of the present invention.

The edge bead radiation processing apparatus in accord with the second embodiment of the present invention is generally related to the edge bead fluid processing apparatus in accord with the first embodiment of the present invention, but rather than being directed towards supplying a volume of fluid to an annular edge ring of a substrate the edge bead radiation processing apparatus in accord with the second embodiment of the present invention is instead intended to provide a dose of radiation to the annular edge ring (or annular edge bead) of the substrate.

Thus, as is illustrated within the schematic diagram of FIG. 2, there is shown an edge bead radiation processing apparatus also comprising a platen 10 upon which there may be received, positioned and affixed a substrate 12 within the edge bead radiation processing apparatus of the second embodiment of the present invention.

In contrast to the edge bead fluid processing apparatus of the first embodiment of the present invention, the edge bead radiation processing apparatus of the second embodiment of the present invention also comprises a radiation source 22 (rather than a pair of supply fluid streams), in conjunction with appropriate radiation beam shaping optics 24 and a pair of coaxial radiation beam stops 26. The edge bead radiation processing apparatus also comprises a pair of upper geometrically inclined mirrors 28*a* and 28*b* vertically movably positioned with respect to a pair of lower geometrically inclined mirrors 30a and 30b, such that vertical movement of the pair of upper geometrically inclined mirrors 28a and 28b with respect to the pair of lower geometrically inclined mirrors 30a and 30b provides for variable lateral positioning of an annular edge ring 32 of radiation reaching the substrate 12.

As is understood by a person skilled in the art, and in accord with the first embodiment of the invention, each of the pair of upper geometrically inclined mirrors 28a and 28b and the pair of lower geometrically inclined mirrors 30a and 30b is intended as representative of a single contiguous geometrically inclined mirror which provides for a complete irradiation of the annular edge ring 32 absent movement, such as rotation, of the substrate 12 with respect to the foregoing optical components (which comprise an optical apparatus) within the edge bead radiation processing apparatus of the second embodiment of the invention with respect to the radiation source 26. Within FIG. 2, radiation beams directions of travel are indicated by the series of arrows.

Within the second embodiment of the present invention, the radiation source 22 may be selected from the group including but not limited to ultraviolet, visible and infrared optical radiation sources, but most typically and preferably ultraviolet optical radiation sources.

As is also shown within the schematic diagram of FIG. 2, a central portion of a radiation beam penetrates through a central aperture defined within the pair of upper geometrically inclined mirrors 28a and 28b and the pair of lower geometrically inclined mirrors 30a and 30b such as to reach another pair of mirrors 34 and 36 separated by an additional beam shaping apparatus 35 such as to provide a separate dose of radiation to an internal area 38 predefined within the substrate 12 at a location interior the annular edge ring 32.

As is understood by a person skilled in the art, the second embodiment of the present invention provides particular value under circumstances where it is desirable to irradiate an annular edge bead of a positive photoresist material layer formed upon a substrate simultaneously with a clearout window portion of the positive photoresist material layer. The clearout window portion of the positive photoresist material layer might otherwise cover substrate identification information or substrate alignment fiducials inscribed within the substrate.

As is understood by a person skilled in the art, while the first embodiment of the present invention and the second embodiment of the present invention illustrate the present invention as a separate pair of edge bead processing apparatus including an edge bead fluid processing apparatus and an edge bead radiation processing apparatus, a fluid nozzle in accord with the edge bead fluid processing apparatus of the first embodiment of the present invention may be incorporated within a single edge bead processing apparatus with a reflective optical apparatus in accord with the edge bead radiation processing apparatus in accord with the second embodiment of the present invention. Thus, within a single edge bead processing apparatus there may be provided for both fluid processing of an annular edge ring of a substrate and radiation processing of the annular edge ring of the substrate.

As is understood by a person skilled in the art, the preferred embodiments of the present invention are illustrative of the present invention rather than limiting of the present invention. Revisions and modifications may be made to dimensions and components provided within the preferred embodiments of the present invention while still providing apparatus and methods in accord with the present invention, further in accord with the accompanying claims.

What is claimed is:

1. An edge bead processing apparatus comprising:
   a platen suitable for receiving a substrate; and
   at least one of:
      a nozzle suitable for directing a volume of fluid onto an annular edge ring of the substrate when received upon the platen, wherein the nozzle is geometrically configured to direct the volume of fluid simultaneously to all portions of the annular edge ring absent motion of the substrate with respect to the nozzle; and
      a reflective optical apparatus suitable for directing a dose of radiation to the annular edge ring of the substrate when received upon the platen, wherein the reflective optical apparatus is geometrically configured to direct the dose of radiation to all portions of the annular edge ring absent motion of the substrate with respect to the reflective optical apparatus.

2. The edge bead processing apparatus of claim 1 wherein the substrate is employed within a microelectronic fabrication selected from the group consisting of integrated circuit microelectronic fabrications, ceramic substrate microelectronic fabrications and optoelectronic microelectronic fabrications.

3. The edge bead processing apparatus of claim 1 wherein the edge bead processing apparatus comprises only the nozzle suitable for directing the volume of fluid onto the annular edge ring of the substrate and not the reflective optical apparatus suitable for directing the dose of radiation to the annular edge ring of the substrate.

4. The edge bead processing apparatus of claim 1 wherein the edge bead processing apparatus comprises only the reflective optical apparatus suitable for directing the dose of radiation to the annular edge ring of the substrate and not the nozzle suitable for directing the volume of fluid onto the annular edge ring of the substrate.

5. The edge bead processing apparatus of claim 1 wherein the edge bead processing apparatus comprises both the nozzle suitable for directing the volume of fluid onto the annular edge ring of the substrate and the reflective optical apparatus suitable for directing the dose of radiation to the annular edge ring of the substrate.

6. The edge bead processing apparatus of claim 1 wherein the annular edge ring has a ring width of from about 3 to about 8 millimeters.

7. The edge bead processing apparatus of claim 1 further comprising a window within the nozzle for purposes of irradiating the volume of fluid.

8. The edge bead processing apparatus of claim 1 wherein the reflective optical apparatus also provides for directing a second dose of radiation to a region of the substrate other than the annular edge ring of the substrate.

* * * * *